United States Patent
Johnson

(10) Patent No.: US 7,847,310 B2
(45) Date of Patent: Dec. 7, 2010

(54) MIGRATION ENHANCED EPITAXY FABRICATION OF ACTIVE REGIONS HAVING QUANTUM WELLS

(75) Inventor: Ralph H. Johnson, Murphy, TX (US)

(73) Assignee: Finisar Corporation, Sunnyvale, CA (US)

( * ) Notice: Subject to any disclaimer, the term of this patent is extended or adjusted under 35 U.S.C. 154(b) by 2 days.

(21) Appl. No.: 12/250,405

(22) Filed: Oct. 13, 2008

(65) Prior Publication Data
US 2009/0034571 A1 Feb. 5, 2009

Related U.S. Application Data

(60) Division of application No. 11/456,779, filed on Jul. 11, 2006, now Pat. No. 7,435,660, which is a continuation-in-part of application No. 10/931,194, filed on Aug. 31, 2004, now Pat. No. 7,378,680, which is a division of application No. 10/352,293, filed on Jan. 27, 2003, now abandoned, which is a continuation-in-part of application No. 09/217,223, filed on Dec. 21, 1998, now Pat. No. 6,603,784, and a continuation-in-part of application No. 10/026,016, filed on Dec. 20, 2001, now Pat. No. 7,095,770, and a continuation-in-part of application No. 10/026,019, filed on Dec. 20, 2001, now Pat. No. 7,408,964, and a continuation-in-part of application No. 10/026,055, filed on Dec. 20, 2000, now Pat. No. 6,922,426, and a continuation-in-part of application No. 10/026,044, filed on Dec. 27, 2001, now Pat. No. 7,058,112, and a continuation-in-part of application No. 10/026,020, filed on Dec. 27, 2001, now Pat. No. 6,975,660.

(60) Provisional application No. 60/698,115, filed on Jul. 11, 2005.

(51) Int. Cl.
*H01L 31/00* (2006.01)

(52) U.S. Cl. ............................ 257/98; 257/94; 257/96; 372/45; 372/46; 438/29; 438/401; 438/462

(58) Field of Classification Search ................... 257/94, 257/96, 98; 372/45, 46, 96; 438/29, 45, 438/401, 462
See application file for complete search history.

(56) References Cited

U.S. PATENT DOCUMENTS

| 5,960,018 A * | 9/1999 | Jewell et al. ............ 372/45.011 |
| 6,546,031 B1 * | 4/2003 | Jewell et al. ............. 372/45.01 |
| 6,687,281 B2 * | 2/2004 | Coldren et al. ................ 372/96 |
| 2005/0184303 A1 * | 8/2005 | Tandon et al. ................. 257/98 |

* cited by examiner

*Primary Examiner*—Fernando L Toledo
(74) *Attorney, Agent, or Firm*—Workman Nydegger

(57) ABSTRACT

Semiconductor lasers, such as VCSELs having active regions with flattening layers associated with nitrogen-containing quantum wells are disclosed. MEE (Migration Enhanced Epitaxy) is used to form a flattening layer upon which a quantum well is formed and thereby enhance smoothness of quantum well interfaces and to achieve narrowing of the spectrum of light emitted from nitrogen containing quantum wells. A cap layer is also formed over the quantum well.

17 Claims, 7 Drawing Sheets

MIGRATION ENHANCED EPITAXY FABRICATION OF ACTIVE REGIONS HAVING QUANTUM WELLS

CROSS-REFERENCE TO RELATED APPLICATIONS

This application a divisional of U.S. application Ser. No. 11/456,779, filed on Jul. 11, 2006, which claims the benefit of U.S. Provisional Patent Application No. 60/698,115, filed Jul. 11, 2005 and is a continuation-in-part of application Ser. No. 10/931,194 filed Aug. 31, 2004, which is a divisional of application Ser. No. 10/352,293, filed Jan. 27, 2003, now abandoned, which is a continuation-in-part to the following U.S. patent applications: application Ser. No. 09/217,223, filed Dec. 21, 1998, now U.S. Pat. No. 6,603,784; application Ser. No. 10/026,016, filed Dec. 20, 2001; application Ser. No. 10/026,019, filed Dec. 20, 2001; application Ser. No. 10/026,055, filed Dec. 20, 2001; application Ser. No. 10/026,044, filed Dec. 27, 2001; and application Ser. No. 10/026,050, filed Dec. 27, 2001, all of which are hereby incorporated by reference in their entireties.

BACKGROUND OF THE INVENTION

1. The Field of the Invention

Embodiments of the present invention generally relate to vertical cavity surface emitting lasers (VCSELs) and optical transceivers incorporating such VCSELs. More particularly, embodiments of the present invention relate to VCSELs having improved active regions.

2. Related Technology

Solid-state semiconductor lasers are important devices in applications such as optoelectronic communication systems and high-speed printing systems. Among the different types of lasers, there has been an increased interest in vertical cavity surface emitting lasers (VCSELs). One reason for growing interest in VCSELs is that edge emitting lasers produce a beam with a large angular divergence, making efficient collection of the emitted beam more difficult. Furthermore, edge emitting lasers cannot be tested until the wafer is cleaved into individual devices, the edges of which form the mirror facets of each device. By contrast, not only does the beam of a VCSEL have a small angular divergence, a VCSEL emits light normal to the surface of the wafer. Additionally, because VCSELs generally incorporate mirrors monolithically in their design, they allow for on-wafer testing and the fabrication of one-dimensional or two-dimensional laser arrays.

VCSELs are typically made by growing several layers on a substrate material. VCSELs include a first mirrored stack, formed on the substrate by semiconductor manufacturing techniques, an active region, formed on top of the first mirrored stack, and a second mirrored stack formed on top of the active region. By providing a first contact on top of the second mirrored stack, and a second contact on the backside of the substrate, a current is forced through the active region. Currents through the VCSEL above a threshold current cause laser emissions from the active layer as electrons switch from the conduction band to the valance band, producing photons and thereby generating the light.

The active region is further made up of one or more quantum wells sandwiched between two spacer cladding regions. Inside the spacers, the active region is sandwiched by confining layers. The confining layers or regions are used to provide electrical confinement of minority carriers. By selecting the appropriate materials for the quantum well, the confining layers, and the barrier layers, a VCSEL generally may be grown or fabricated that generates light at a desirable, predetermined wavelength. For example, by using InGaAs quantum wells on GaAs substrates, longer wavelength VCSELs can be produced. The use of InGaAs quantum wells, however, causes strain in the quantum wells. If the quantum wells are grown past their critical thickness, they can relax by creating dislocations, and thus a degraded active region results.

VCSELs made with GaAs and that emit light in the 850 nanometer range are known in the art. Because the quantum well for the short wavelength 850 nanometer VCSELs is made from GaAs (the same material as the substrate) the various epitaxially deposited layers, whose thickness is related to wavelength, are able to maintain the minimal mechanical strain without mechanical relaxation. If one were to use InGaAs in the active region at the larger 1.3 μm wavelength device range (e.g., 1200-1650 nm), however, the lattice mismatch is generally such that the quantum well layers would tend to relax their strains and suffer dislocations, produce slip lines or develop island growth, which would interfere with proper lasing by acting as non radiative recombination centers.

In order to go to the proper bandgap for what is referred to in the art as a 1.3 μm wavelength (i.e. greater than 1260 nm) semiconductor lasers, one generally uses InGaAs, GaAsSb or some combination thereof instead of GaAs in the active layer. Indium gallium arsenide (InGaAs) and gallium arsenide antimonide (GaAsSb), however, do not possess the same lattice constant as GaAs at the compositions useful for 1.3 micron lasers. This makes it very difficult to build a proper quantum well structure.

The thickness of the various layers in the active region, while not arbitrary, has some flexibility within the constraints of the design and the process. The combined thickness of the spacers, the confining layers, and the layers of the active regions sandwiched by the mirrors must be such that a Fabry-Perot resonator is formed. The quantum wells should generally be positioned so that they are roughly centered at an antinode of the optical electric field. These two requirements define the spacer thickness in terms of the other layer thicknesses.

Long wavelength quantum wells are a challenge to construct. The semiconductor laser, e.g., VCSEL, art needs means to achieve long wavelength quantum wells normally fabricated on GaAs substrates. It is therefore very desirable to come up with a quantum well (i.e. the active layer (or quantum well layer) and the barrier layers surrounding the active layer) making use of materials such as GaAs, InGaAs or GaAsSb in the construction of a VCSEL operational above the 1200 nm range.

The present inventors recognized that it would be advantageous to remedy the foregoing and other deficiencies in conventional devices and to facilitate the production of longer wavelength VCSELs by introducing Migration Enhanced Epitaxy (MEE) into the VCSEL fabrication process. Additionally, there is a continuing need for improved VCSELS long wavelength VCSELs, and methods of forming the long wavelength VCSELs through improved techniques that use Migration Enhanced Epitaxy (MEE).

BRIEF SUMMARY OF THE INVENTION

Embodiments of the present invention relate to semiconductor lasers such as VCSELs. Particularly, embodiments of the invention focus on semiconductor lasers having active regions with nitrogen containing long wavelength quantum wells. According to disclosed embodiments, the quantum wells are formed upon flattening layers. The flattening layers can be formed using Migration Enhanced Epitaxy (MEE) to flatten the surface of the growth interface and to grow material adjacent to the quantum wells with lower point defect densities. This prevents seeds for the growth of 3 dimensional structures which ruin dilute nitrogen based quantum wells if they occur.

In example embodiments, MEE is used to form the flattening layers of alternating monolayers of group III and group V materials. The flux of the group V material is varied to enhance the effect. By using a low group V material flux during the majority of the MEE the flattening effect is enhanced due to extremely enhanced mobility of the group III material. By using a high group V material flux just before and during the growth of the quantum wells, the mobility in the quantum wells is decreased substantially, reducing the ability of the nitrogen compounds to form 3 dimensional structures or segregate into different compounds. In addition, a thin cap layer, for example formed of GaAs, is grown on top of the quantum well to stabilize the quantum well before it has an opportunity to become three dimensional or have phase segregation. The process is repeated for more quantum wells so that a multi quantum well active region can be formed.

In a first example embodiment an active region associated with a semiconductor laser is provided. The active region preferably forms part of a vertical cavity surface emitting laser (VCSEL). The active region generally includes: a flattening layer comprising a first section having a predetermined number of alternating monolayers of group III and group V elements and a second section formed over the first section and having a predetermined number of monolayers formed with a higher group V flux; a nitrogen containing quantum well formed on the flattening layer; and a cap layer, preferably GaAs, formed on the quantum well. Preferred active regions according to embodiments of the invention have multiple quantum wells in the active region, each quantum well having a flattening layer on a first surface and a cap layer on the opposing surface.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Reference will now be made to the drawings to describe various aspects of exemplary embodiments of the invention. It is to be understood that the drawings are diagrammatic and schematic representations of such exemplary embodiments, and are not limiting of the present invention, nor are they necessarily drawn to scale.

In the following description, numerous specific details are set forth in order to provide a thorough understanding of the present invention. It will be obvious, however, to one skilled in the art that the present invention may be practiced without these specific details. In other instances, well-known aspects of optical systems and vertical cavity surface emitting lasers (VCSELs) in particular have not been described in great detail in order to avoid unnecessarily obscuring the present invention.

Figure 1:
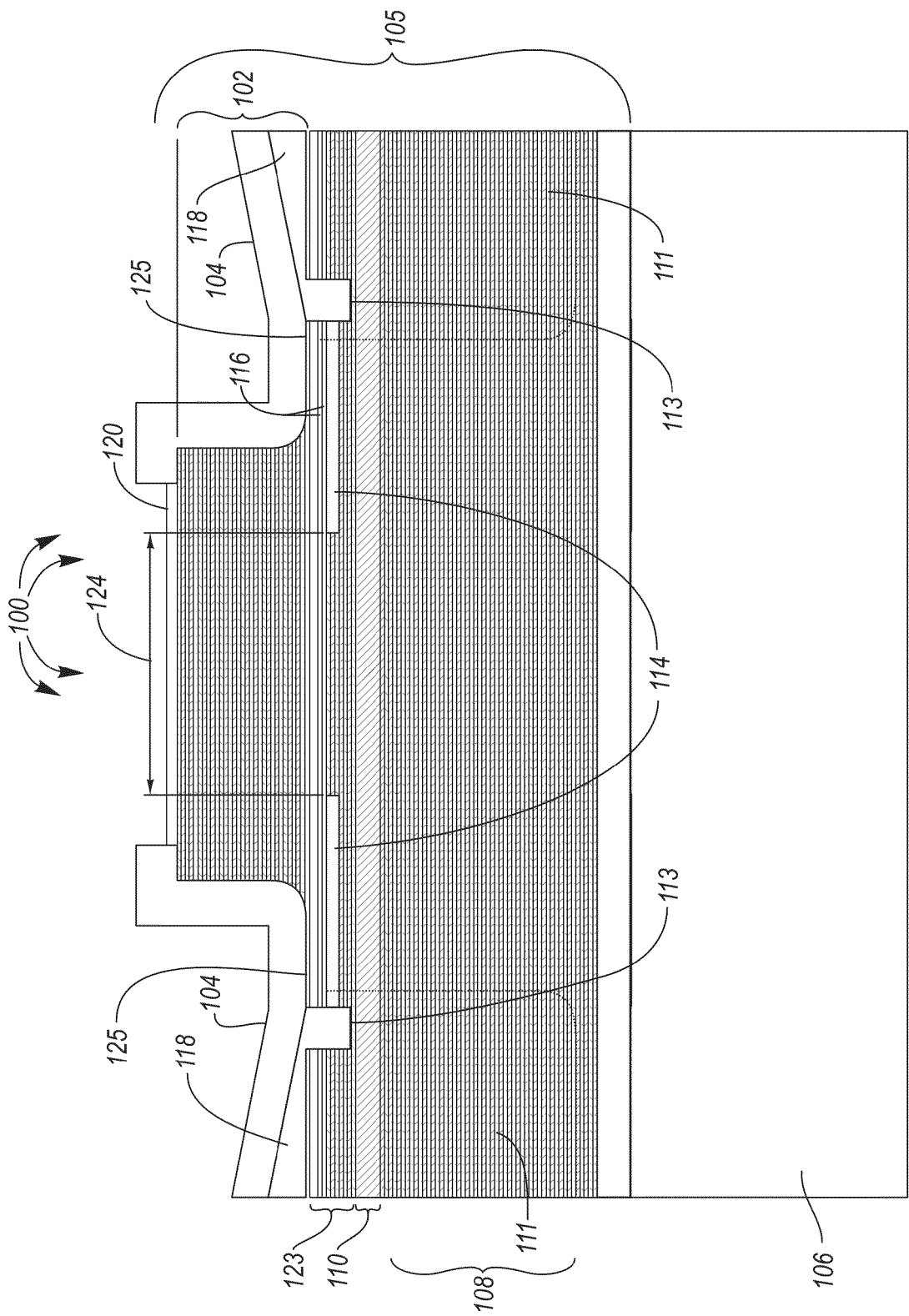
FIG. 1 is a perspective representation of a VCSEL according to the present invention.

With reference now FIG. 1, an illustrative embodiment includes a VCSEL 100 with an undoped top mirror 102 and intracavity contact 104. The VCSEL is formed from an epitaxial structure 105 that includes various layers of semiconductor materials that will be described in more detail below. The epitaxial structure 105 goes through various etching, deposition and oxide growth stages in the VCSEL 100 formation.

The VCSEL 100 is formed on a substrate 106. The substrate 106, in this example, is a gallium arsenide (GaAs) substrate. In other embodiments, the substrate 106 may be other material such as other III-V semiconductor materials.

A bottom mirror 108 is formed on the substrate 106. The bottom mirror has the same conductivity type as the substrate. In the example, the bottom mirror and substrate are n-type. The bottom mirror 108 is a distributed Bragg reflector (DBR) mirror that includes a number of alternating layers of high and low index of refraction materials. In the example shown, the bottom mirror 108 includes alternating layers of aluminum arsenide (AlAs) and GaAs. The bottom mirror 108 is typically doped with a donor impurity such as silicon such that the bottom mirror is conductive.

In one embodiment a special ramp may be formed between the alternating layers of the bottom mirror 108. The ramp provides a gradual change of electronic affinity between the alternating layers. In the embodiment shown, the ramp includes a step from AlAs to $Al_xGa_{1-x}As$ where x is about 33 to 35% followed by an essentially linear ramp of aluminum composition from about 33% to zero (GaAs) after the step.

The electron affinity is essentially constant across the step, and thus there is no need to ramp through the step. Examples of similar special ramps are disclosed in U.S. patent application Ser. No. 10/767,920, titled "Electron Affinity Engineered VCSELs" filed Jan. 29, 2004, which is incorporated herein by reference.

An active region 110 is formed on the bottom mirror 108 and is bounded laterally by proton bombarded isolation implants 111, which will be discussed in more detail below, and isolation trenches 113. The active region 110 includes one or more quantum well(s), flattening layer(s) and cap layer(s) as described hereinbelow. The central region of the quantum wells under the oxide aperture 124 may also be referred to as the optical gain region. This central region of the quantum wells is the location where current through the active region 110 and the presence of injected free carriers causes population inversion and optical gain. These free carriers moving from conduction band quantum well states to valence band quantum well states (i.e. across the band gap) cause the emission of photons. An oxide layer 114 is formed in the conduction layer region 123 above the active layer 110 to provide an aperture 124 for lateral definition of the laser optical cavity and for directing bias current to the central region of the VCSEL active region 110.

In the embodiment shown, the conduction layer region 123 has a conductivity type opposite that of the substrate and bottom mirror and further includes a periodically doped top portion 116. In the example the conduction layer region 123 is p-type. Two or three periodically doped layers 116 are heavily doped at the optical electric field minima so as to provide a low resistance lateral current path for directing current from the Ohmic contact region 125 to the central region of the active region 110 located under the oxide aperture 124. In the embodiment shown, there are two periodically doped conduction layers 116 each having a sheet resistance of about 500 Ohms per square are doped with an acceptor impurity such as carbon. Using two conduction layers results in a total sheet resistance of about 250 Ohms per square.

Another embodiment of the invention uses three periodically doped conduction layers 116 in the top portion of the conduction layer region 123. Each of the periodically doped conduction layers 116 has a sheet resistance of about 500 Ohms per square. Using three conduction layers results in a total sheet resistance of about 167 Ohms per square. This provides a significant reduction in series resistance which lowers power dissipation and improves VCSEL performance.

A dielectric layer 118 is formed on the conduction layers 116. The dielectric 118 is taper etched to facilitate step coverage of the top contact metal 104 that extends from the Ohmic contact region 125 to the top metal bond pad (not shown in FIG. 1). Thick dielectric 118 is provided under the bond pad to decrease the capacitance between the bond pad metal and the surface of the proton bombarded region under the bond pad which comprises the conduction layer region 123, the active layer 110, and a major portion 111 of the n-type mirror 108. The intracavity contact metal 104 is connected to the top conduction layer 116 forming a top Ohmic contact. The intracavity contacts are also formed such that the intracavity contacts 104 are also connected to a bond pad (not shown) for connecting the VCSEL 100 to a current source. In the example shown, the intracavity contacts 104 extend up around the sides of the undoped top mirror 102. This provides a thermal path for dissipating thermal energy generated in the active region 110 and the conduction layer region 123.

The undoped top mirror 102 in this example is part of a mesa structure. In the example shown the undoped top mirror 102 may be for example alternating layers of higher and lower index of refraction materials. For example, the top mirror may include alternating layers of GaAs and Aluminum Gallium Arsenide (AlGaAs). One present embodiment includes AlGaAs layers that are 87.5% aluminum. Other embodiments may include AlGaAs layers that are generally in the range of 70-100% aluminum. The VCSEL 100 may be constructed using a process that uses an oxide to seal the top mirror 102 during the fabrication process of the VCSEL 100. Because the top mirror 102 is sealed from the high temperature wet oxidation process used to form the oxide layer 114, an alternate construction including alternating layers of GaAs and AlAs may be used for the top mirror 102. Layers of GaAs and AlAs may be advantageous in implementing embodiments with better thermal characteristics. Better thermal characteristics result because binary materials such as GaAs and AlAs are more thermally conductive than alloy materials such as AlGaAs. The use of binary materials in the top mirror also provides the greatest refractive index difference between the mirror layers which makes it possible to achieve the desired top mirror reflectivity with a minimum number of layer pairs. The VCSEL 100 further includes an oxide dielectric 120 to protect portions of the VCSEL 100. In one exemplary embodiment the oxide dielectric 120 has an optical thickness of ½ of the VCSEL wavelength to provide maximum optical reflectivity at the top exit surface of the VCSEL 100.

Various alterations may be made to the VCSEL 100 within the scope of embodiments of the present invention. For example, in one embodiment, one of the conduction layers 116 may be replaced with a tunnel junction. A tunnel junction generally comprises a highly conductive diode. The highly conductive diode includes a thin heavily doped p layer of GaAs and a thin heavily doped layer of n-type GaAs. The tunnel junction layers are sufficiently heavily doped such that the resulting diode conducts by tunneling at zero bias. Low lateral sheet resistance is provided by the heavily doped n-type layer, which has much higher carrier mobility than the heavily doped p-type layer. The intracavity contact 104 is coupled to the heavily doped n-type layer using an alloyed Au:Ge contact layer under the top metal layer that forms the intracavity bond pad. The heavily doped n and p-type layers are located at or near minimums of the optical electronic field to minimize free carrier absorption. While a tunnel junction alone may not have sufficient electrical conductivity to carry the appropriate currents needed to the active region 110, using a large tunnel junction with a large surface area in combination with a conduction layer 116 may provide an adequate amount of conduction. This may allow for the use of a less than optimal tunnel junction in the VCSEL 100.

Very highly conductive tunnel junctions may be difficult to form in VCSEL structures. This difficulty results in part due to the high temperatures used when forming additional layers of the epitaxial structure 105 subsequent to formation of tunnel junctions. These high temperatures cause a diffusion of the high concentration dopants used in the heavily doped layers in the tunnel junction. This diffusion degrades the tunnel junction characteristics. However, using a less than optimal tunnel junction in conjunction with a conduction layer 116 may provide a suitable current path for directing current to the active region 110. Additionally, a highly doped optimal tunnel junction may be used if the upper mirror is deposited at a low temperature made possible by the lack of doping and conduction. The upper mirror may be, simply a dielectric stack.

In another alteration, an undoped bottom mirror, which may be grown on semi-insulating substrates, can be used as the bottom mirror 108. This further reduces free carrier absorption, and further allows for improved reflectivity and thermal conductivity by eliminating ramps between the bottom mirror 108 layers. To make contact to the n side of the p-n junction of the active region 110, a periodically doped n lower spacer (not shown) is grown between the bottom mirror 108 and the quantum wells. In this case a second intracavity contact is made after etching to the periodically doped lower spacer. Etching to the periodically doped lower spacer includes using an etch which stops on or in the periodically doped lower spacer.

In yet another embodiment, performance of VCSELs at longer wavelengths (e.g. greater than 1200 nm) is improved by controlling the polarization of laser emissions from the VCSEL. This may be accomplished by fabricating the VCSEL in an off-axis orientation. Additional details of off-axis orientation are disclosed in Applicants co-pending Provisional Patent Application No. 60/730,798, Entitled Polarization Control In Vertical Cavity Surface Emitting Lasers Using Off-Axis Epitaxy, which is hereby incorporated by reference.

While various layers of the epitaxial structure 105 have been described as being formed on other layers, this does not require that the layers be formed directly on the other layers. Rather, other intervening layers may exist between a layer and the layer in which that layer is formed.

Further details regarding methods of VCSEL fabrication used in the art can be found, for example, in U.S. Pat. No. 5,903,588, incorporated herein by reference in its entirety.

Figure 2:
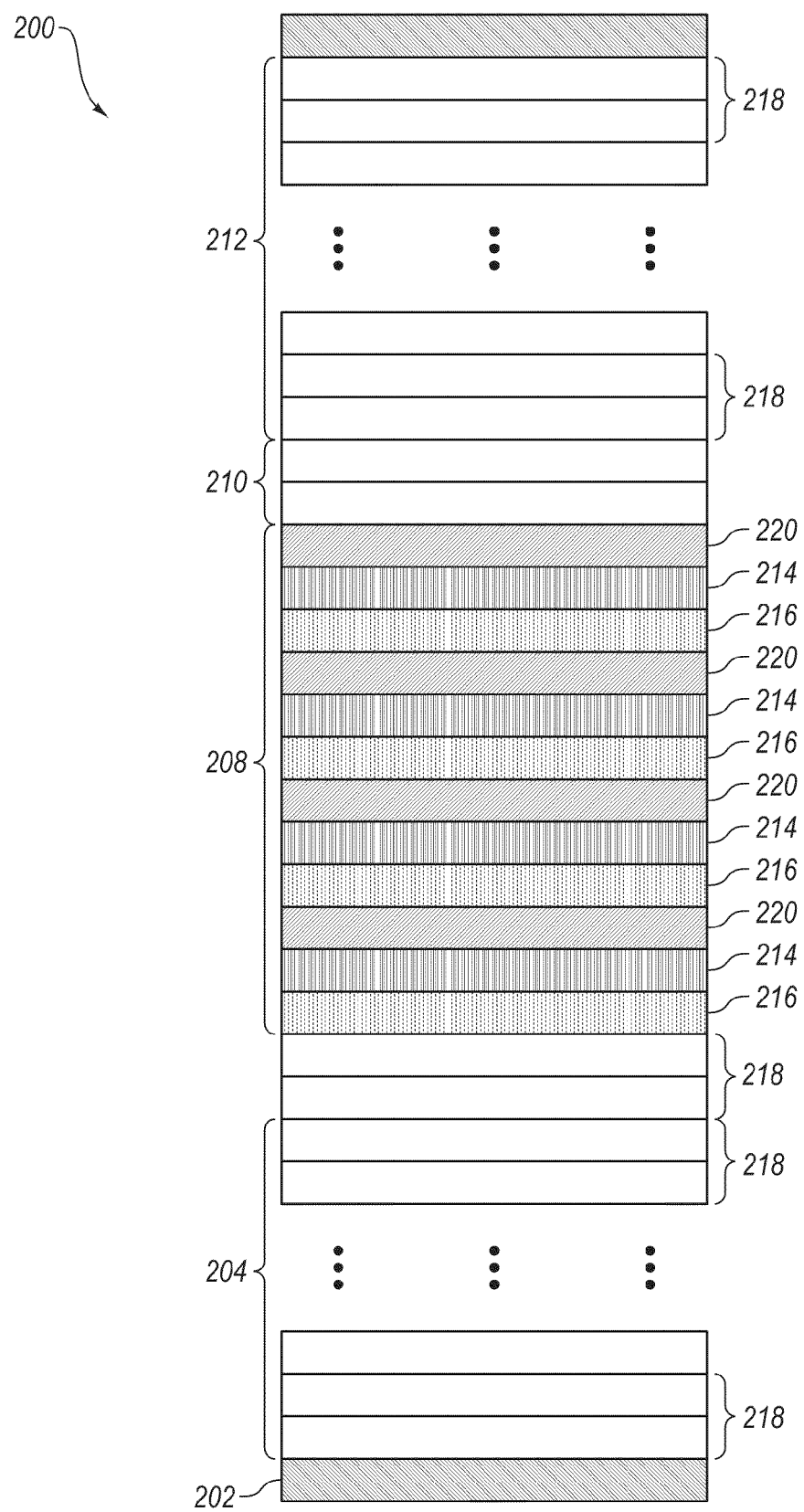
FIG. 2 is an layered schematic illustration of a VCSEL in accordance with an embodiment of the present invention.

Referring to FIG. 2, illustrated is a layered schematic view of a VCSEL 200 according to a preferred embodiment of the invention. The VCSEL 200 can preferably be grown on a GaAs substrate 202 due to the robust nature and low cost of the material. It should be recognized, however, that semiconductor materials, Ge, for example, could also be used as the substrate. The VCSEL 200 can then be formed by disposing layers on the substrate.

In part, VCSEL 200 generally includes: a first mirror stack 204 disposed on the substrate 202, an optional first cladding region 206 disposed on the first mirror stack 204, an active region 208 disposed on the first cladding region 206, an optional second cladding region 210 disposed on the active region 208, and a second mirror stack 212 disposed on the second cladding region 210. A brief description of the layers other than the active region 208 will first be given, followed by a more detailed discussion of the active region 208.

The first mirror stack 204 can be grown by epitaxially depositing mirror pair layers 218 on the substrate 202. In order to crystal lattice match mirror stack 204 to the substrate 202, a suitable semiconductor material system for the mirrored pairs 218 should be deposited. In this specific example, which should not be taken as a limitation of the full scope of the present invention, the substrate 202 is GaAs, therefore a GaAs/AlGaAs material system can be employed. To achieve a high percentage of reflectivity, the number of mirror pair layers 218 in the stack 204 can usually range from 20 to 40, depending on the difference between the refractive indices of the layers. Different refractive indexes are also achievable by altering the Aluminum content in the mirror stack 204.

The use of cladding regions 206, 210 is preferable but optional. The first cladding region 206 can be made of one or more layers epitaxially disposed on the first mirror stack 204. The first cladding region 206 in the currently described embodiment of the invention can be made of a GaAsN material system. Similarly, the second cladding region 210 can be made of one or more layers epitaxially disposed on the active region 208. The second cladding region 210 can also be made of a GaAsN material system.

The second mirror stack 212 can next be grown by epitaxially depositing mirror pair layers 218 on the second cladding region 210. In order to crystal lattice match mirror stack 212 to the substrate 202, a suitable semiconductor material system for the mirrored pairs 218 should be deposited. The substrate 202 is formed of GaAs; therefore a GaAs/AlGaAs material system can be employed. To achieve a high percentage of reflectivity, the number of mirror pair layers 218 in the stack 212 can usually range from 20 to 40, depending on the difference between the refractive indices of the layers. Different refractive indexes are achievable by altering the Aluminum content in the mirror stack 212.

With reference now to active region 208, the active region 208 can include one or more quantum wells 214, depending on the application for which the VCSEL 200 is designed. One of ordinary skill in the art will find it obvious to vary the number of quantum wells 214 in the VCSEL active region 208 as needed. The depicted embodiment includes by way of example 4 quantum wells 214. Each quantum well is formed upon a flattening layer 216 and has a cap layer 220 formed thereover.

Nitrogen added to the quantum well 214 can have the effect of decreasing the strain between the layers, which reduces the band gap energy by both the compositional change and the reduction in strain. Band gap energy reduction increases the wavelength of the emitted photon. This can be desirable to achieve longer wavelength VCSELs. The more nitrogen that is added to the quantum well 214, the greater this reduction in band gap energy can be, and thus longer wavelength VCSELs can be produced.

By using nitrogen in the quantum wells, the strain in the structure can be reduced, which can increase the allowable thickness of the quantum wells, and the energy gap can be reduced, both capable of increasing the allowable wavelength.

The use of nitrogen in the quantum wells can make the valence band discontinuity non-confining or type II. In one embodiment of the invention, using AlGaAs or AlGaAsN as the confining material, however, and GaAsN, AlGaAs, or AlGaAsN or GaAsP barrier layers, the non-confining problem can be reduced. In addition, if Sb replaces a portion of the As in the quantum well, the type II transition caused by nitrogen can further be avoided allowing even more nitrogen. Because even more nitrogen is allowable, more indium is also allowable. Because nitrogen, indium, and antinomy all reduce the band gap energy, the achievable wavelengths extend to wavelengths longer than either 1310 nm used for data communications or 1550 nm used for telecommunications.

By adding nitrogen to the InGaAs quantum wells, the overall strain in the well can become significantly less allowing more indium before reaching the critical thickness, thus making longer wavelength VCSELs possible. In addition, the use of Sb in the quantum well can reduce the band gap energy while avoiding the type II behavior (allowing even more nitrogen), also making longer wavelength VCSELs possible.

The preferred embodiment uses quantum wells 214 of 50 angstroms. The flattening layer has about 10 to about 75 monolayers, preferably about 22 alternating monolayers of Ga and As (or about 62 Å) with a top section of about 3 monolayers. The cap layer is preferably GaAs at about 30 Å thick.

When nitrogen is introduced into the active region 208 or the cladding region 206 or 210, the effective electron mass in the regions can increase dramatically. With this increased effective mass comes an increased density of the states and the thickness of the quantum wells needed to produce a given amount of gain in the active region 208 generally decreases. Therefore, the volume of the quantum well 214 can also be decreased, giving less volume for parasitics to occur in.

Figure 3:
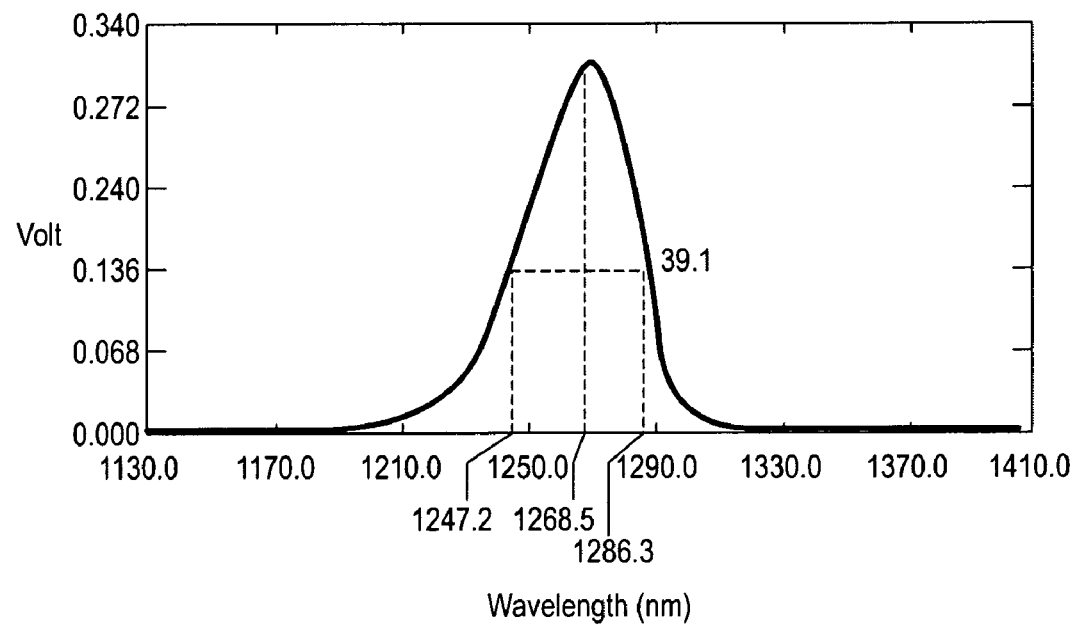
FIG. 3 illustrates a graphical illustration of the photoluminescence for a quantum well containing little nitrogen.
Figure 4:
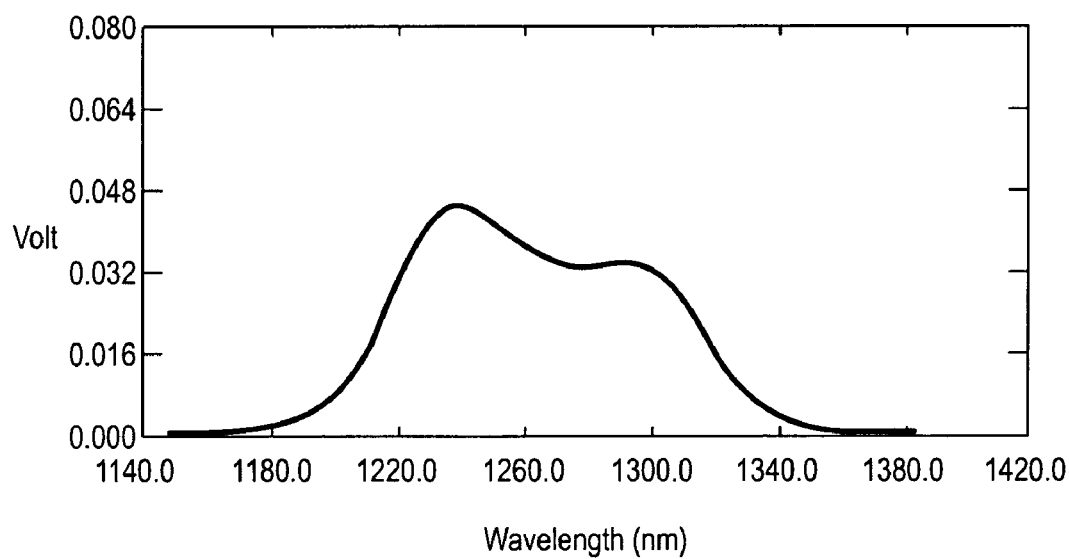
FIG. 4 illustrates a graphical illustration of the photoluminescence for a quantum well containing nitrogen and experiencing 3-D growth.

Quantum wells containing nitrogen tend to grow in a 3-dimensional fashion. FIG. 3 graphically illustrates the photoluminescence spectrum for a quantum well having nitrogen, but which has not grown in a 3-dimensional fashion. As can be seen from the graph, the quantum well provides an acceptable spectrum with a single narrow peak. Referring to FIG. 4, however, a subsequent sample with the same nominal structure as that shown in FIG. 3 is now shown to be experiencing some 3-D growth, as evidenced by the broad multi-peaked spectrum. Broad double peaks shown in the graph imply quantum dot development or segregation. Quantum wells that contain any amount of nitrogen can experience 3-D growth, thereby causing broadening of the spectrum as well as enabling the formation of quantum dots. By flattening the adjoining surface just before the growth of nitrogen containing quantum wells, no seed is provided or made available for 3-D growth within the quantum well layers of a device. Sometimes barrier layers associated with a quantum well will contain nitrogen as well, therefore any non-nitrogen layer should be flattened prior to growth of the nitrogen containing layer whether the nitrogen-containing layer is a barrier layer or quantum well.

Figure 5:
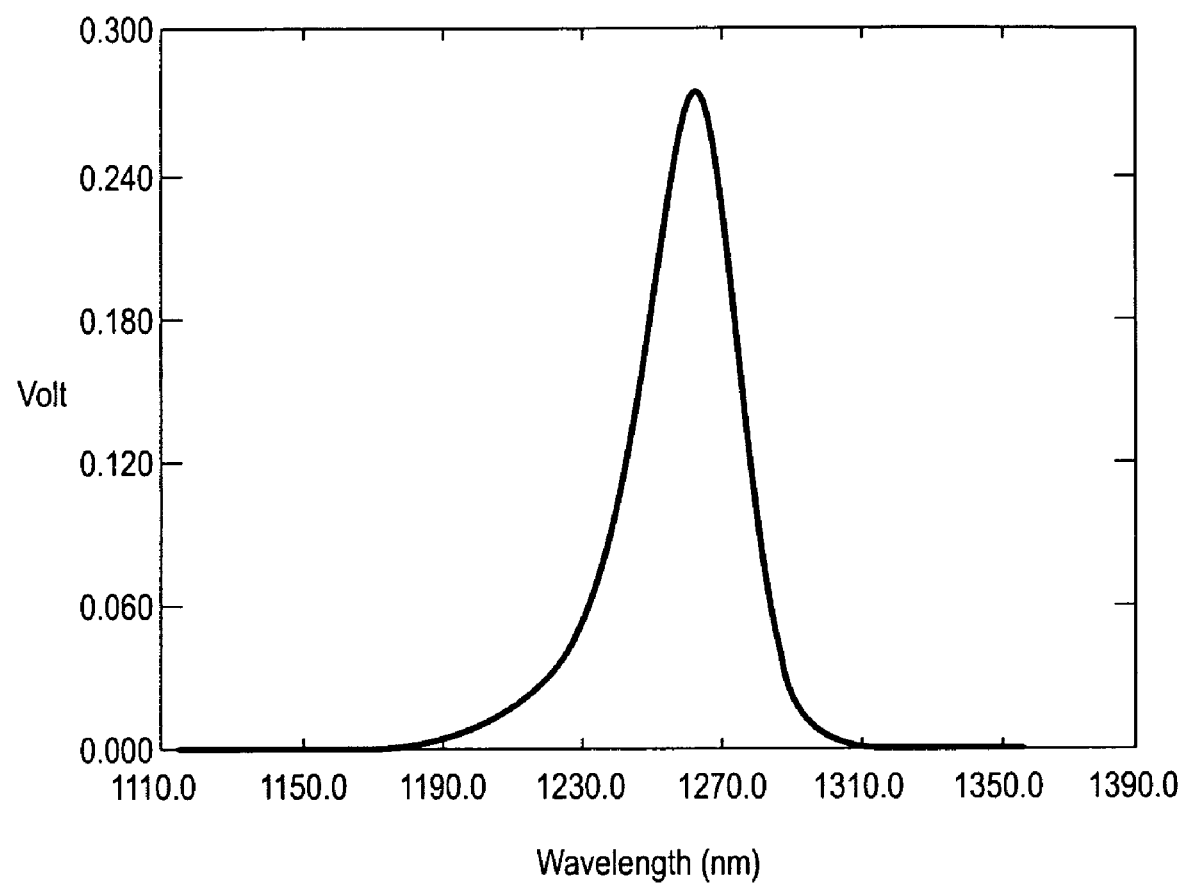
FIG. 5 is a graphical illustration of a desirable photoluminescence spectrum where a device includes nitrogen in its active region.

The present inventors have found that Migration Enhanced Epitaxy (MEE) can be provided as a solution for flattening surfaces, and thereby eliminate quantum dot production or other 3-dimensional growth effects. Referring to FIG. 5, a graphical illustration of a more desirable photoluminescence spectrum is shown. It is well known that spectral measurements using photoluminescence can be used to reveal the results of a MEE processed device.

MEE can be used to flatten device layers before steps are taken to grow nitrogen containing quantum wells, resulting in desirable long wavelength spectra. In a device that uses nitrogen and any combination of In, Ga, As and Sb in the quantum wells, using a flattening layer before the growth of any nitrogen containing layers can be very beneficial. Using MEE, for example, before, and/or after and/or between a nitrogen-containing quantum wells has been shown by the present inventors to flatten a surface such that there is no seed available for 3-D growth.

According to the present invention, the use of MEE for achieving flattening can be performed by alternately depositing single atomic layers of group III constituents and group V constituents. In particular Ga and As work well on a GaAs substrate.

Quantum wells containing InGaAsN with optional Sb do not exist in equilibrium. Phase segregation can take place as a result. To avoid phase segregation within quantum wells, low growth temperatures have been used during processing. Unfortunately low growth temperatures can result in point defects, which can cause poor optical quality in the device. Furthermore, higher growth temperatures can be effectively maintained in InGaAsN quantum wells, and can thus result in high quality optical material if a high flux of As is also used. High As flux can eliminate Group III dangling bonds and also prevent the physical motion of constituents responsible for enabling phase segregation. The As also serves to inhibit 3-dimensional growth. During the growth of nitrogen containing layers it has been found beneficial to use As fluxes of at least 1.1E-5 torr beam equivalent pressure, preferably about 2.06E-5 torr beam equivalent pressure. Although both $As_4$ and $As_2$ can be used it is preferably to use predominantly $As_2$.

A monolayer of Ga with no As to stabilize it migrates rapidly and flattens the surface. Reflected high energy electron diffraction (RHEED) is a useful technique to determine that a surface is flat. High RHEED oscillation amplitude generally indicates that the surface is flat. Optimum device results can be observed where a maximum RHEED oscillation signal is achieved with a substrate temperature of about 400° C. during the MEE process without Sb.

High flux can be achieved when beam pressure of As is maintained above about 1.1E-5 Torr beam equivalent pressure (BEP), preferably above about 2.06E-5 Torr BEP, more preferably above about 4.5E-5 Torr BEP. This is a much higher beam equivalent pressure setting than is normally used for such quantum wells. Flux achieved with this BEP can prevent phase segregation and enable quantum well growth at elevated temperatures of about 400° C. (or 490° C. if the quantum wells contain Sb). It will be understood by those skilled in the art that the above and other Torr BEP measurements are subject to some variations, as much as 20% in some instances, depending upon the accuracy of the device used to measure the flux.

In addition, the present inventors have determined that $As_4$ can also be an arsenic source rather than the alternative form $As_2$, while enabling the maintenance of acceptable flux guidelines. $As_4$ instead of $As_2$ can be used to achieve high As flux. Changing the species of arsenic can be as simple as changing the cracker temperature, where ~900° C. cracker temperature can give predominantly $As_2$, while less than 650° C. can predominantly result in $As_4$.

Figure 6:
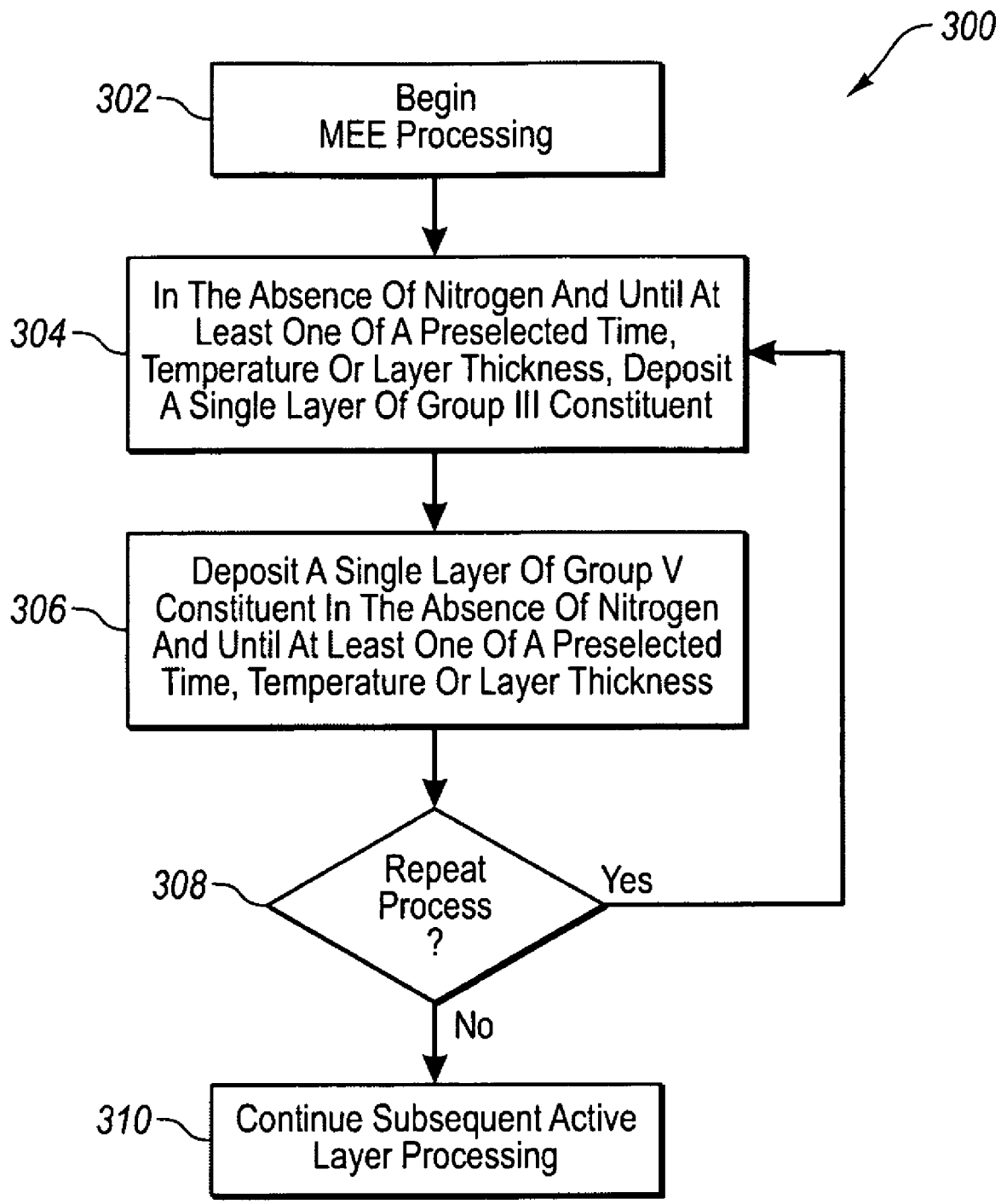
FIG. 6 is a flow diagram illustrating acts that can be performed to obtain a nitrogen free flattening layer of alternating group III and group V monolayers according to embodiments of the present invention.

Referring to FIG. 6, a flow diagram 300 is shown outlining acts that can be taken during device fabrication to achieve alternating monolayers for layer flattening in an active region using MEE processing techniques. The present inventors have found that layer flattening within a semiconductor laser active region can occur by alternating the growth of As and Ga, which are referred to herein as an example of material that can be used, but should not be taken to be a limitation of the present invention. MEE processing begins as shown at act 302. As shown in act 304, a group III material such as Ga is used during processing of a first layer. During this act of the process a single layer of a group III constituent is deposited in the absence of nitrogen. Next, as shown in act 306, a group V material such as As is used during processing of a second layer. During this act of the process a single layer of group V constituent is deposited in the absence of nitrogen and until at least one of a preselected time, temperature, and layer thickness is met. Because of the high group V vapor pressure generally an excess As flux can be used, but it is advantageous to minimize the excess. As shown in act 308, acts 304 and 306 can be repeated until at least one of a preselected time, temperature, or number of alternating layers is achieved. Finally, as shown in act 310, the process can then be transitioned to subsequent active region/layer processing as shown when the process of acts 304-308 is completed.

Non-nitrogen steps of the MEE process can be carried out by alternately opening and closing Ga and As shutters so that they are not both open at the same time, and so that the time the Ga shutter is open deposits 1 atomic layer. In an example, the present inventors opened a 0.5 monolayer per second Gallium source for 2 seconds alternating with the As source for 4 seconds. During the time the Ga source was open without As, the Ga atoms migrated long distances to find steps. This resulted in flattening of the surface.

The present inventors have found that, while the Ga shutter is closed and the As shutter is open the surface becomes arsenic stabilized, and after a waiting period the surface will flatten even further. The growth temperatures, As vapor pressures, and sticking coefficients can be such that some excess of As is required.

Figure 7:
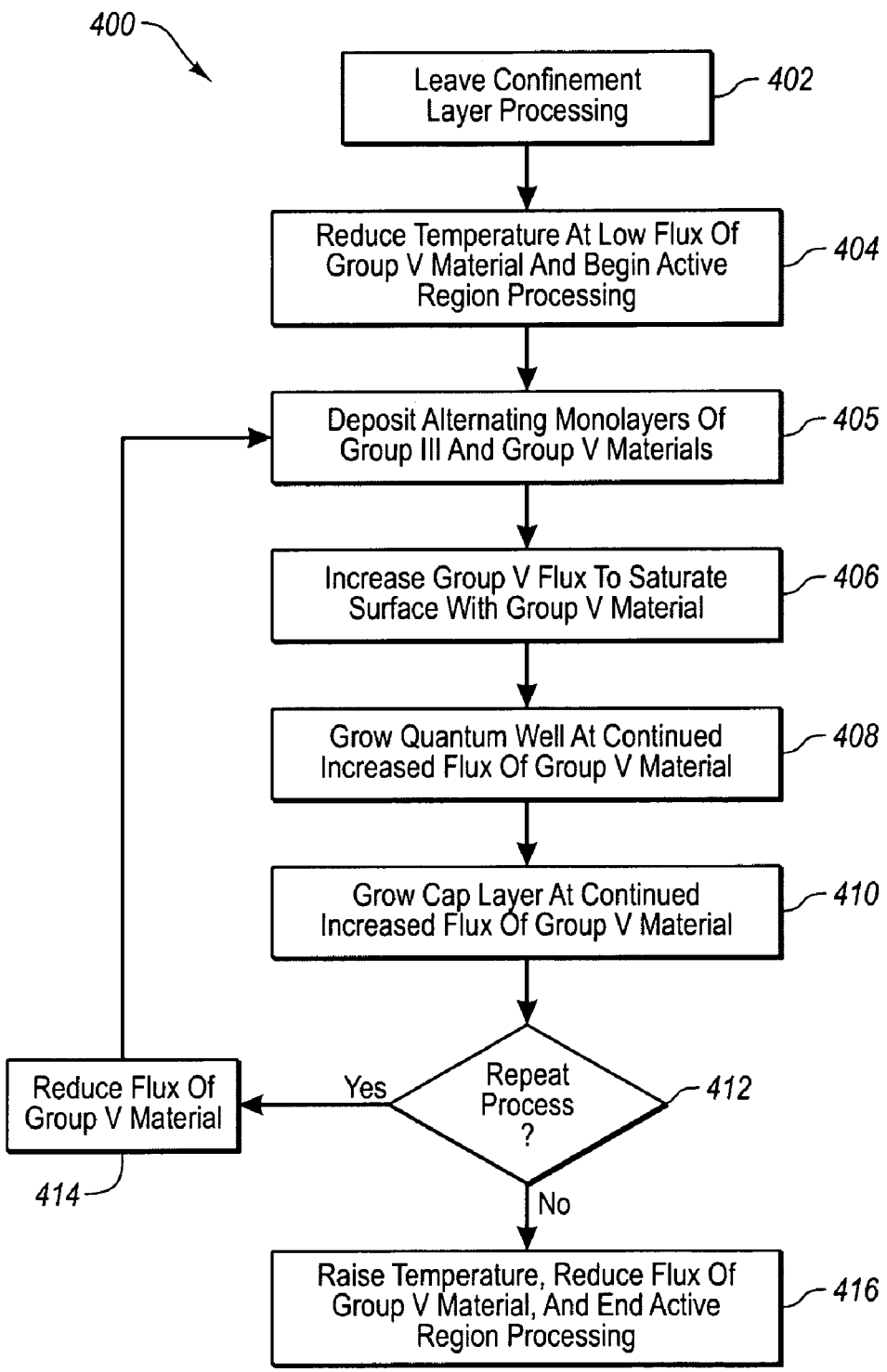
FIG. 7 is a flow diagram illustrating acts that can be performed to obtain an active region according to embodiments of the present invention.

Referring to FIG. 7, a flow diagram 400 illustrates steps that can be taken during semiconductor laser wafer fabrication to create an active region while maintaining flattening of layers within the active region, thus producing higher performance quantum wells than have been heretofore provided. In a preferred embodiment, layer flattening occurs by alternating the growth of group III and V materials. The process can optionally begin as shown at block 402 after creation of a confinement layer that typically precedes the active region.

The confinement layer process is typically formed at a temperature of about 585° C. whereas the active region formation processes of the invention are more preferably performed according to the invention at a temperature of from about 400° C. to about 490° C., preferably about 400° C. for Sb free quantum wells, and preferably about 490° C. for quantum wells containing Sb. As a result, process 400 includes a step of reducing the temperature, as indicated at block 404, to a range of from about 400° C. to about 490° C. for quantum wells containing Sb. Forming quantum wells at this temperature range helps minimize point defects.

As shown in step 405, at least one nitrogen-free layer is formed using MEE processing by alternately depositing single atomic layers of group III and group V constituents and until at least one of a preselected time, temperature and number of alternating layers is achieved. Processing for the step denoted by block 405 can be carried out using the process steps shown in FIG. 6. This step is preferably carried out at a flux of from about 5.85E-6 Torr BEP to about 1.04E-5 Torr BEP, more preferably about 7.8E-6 Torr BEP.

Next, as shown at block 406, the flux of the group V constituent is increased during the formation of the last few monolayers (i.e. there is an excess or a greater excess of group V constituents during the group V flux as compared to the group V flux during growth of the underlying monolayers). Increasing the flux of the group V constituents results in a greater concentration of the group V constituent in the last few monolayers as compared to the underlying monolayers. In an exemplary embodiment the greater concentration of group V constituent is grown in about 1-10 monolayers, more preferably in about 2-5 monolayers. [**Do these ranges make sense?] The increased flux is preferably from about 3.8E-5 Torr BEP to about 6.00E-5 Torr BEP, more preferably about 4.5E-5 Torr BEP. If Sb is used the optimal As flux is from about 1.2E-5 Torr BEP to about 4E-5 Torr BEP, preferably about 2E-5.

Increasing the flux of the group V constituent in the last few monolayers of the flattening layer saturates the surface of the flattening layer with the group V constituent. Saturating the surface of the flattening layer with group V constituents prepares the surface of the flattening layer for growing a quantum well layer using a similarly high group V flux.

A nitrogen containing quantum well is next grown on the nitrogen free flattening layer (indicated by block 408) without MEE and at a continued high group V flux (e.g. As). The high As flux can eliminate Group III dangling bonds and also prevent the physical motion of constituents responsible for enabling phase segregation. The shutters on the nitrogen line are opened for the latter layers to form the preferred nitrogen containing quantum wells and gain the above discussed benefits of nitrogen containing quantum wells. In addition to nitrogen, the quantum well can preferably include GaAs and one or more of antimony, indium and phosphorous.

Next as indicated by block 410, a cap layer is formed over the quantum well to prevent the materials of the quantum well from having a chance to move around and segregate. The cap layer is substantially free of at least one of In or N. In a preferred embodiment, the cap layer is substantially free of at least N and most preferably substantially free of both In and N. Since In and N have a tendency to cause segregation, forming a cap layer free of one or both of these constituents can reduce segregation in the cap layer. The cap layer fixes the material in the quantum well and inhibits segregation within the quantum well.

The cap layer can be made nitrogen free and/or Indium free by shuttering the nitrogen valve closed before beginning formation of the cap layer. The cap layer preferably has a thickness of from about 10 Å to about 50 Å, more preferably from about 20 Å to about 40 Å, still more preferably about 30 Å, and is grown at a rate of about 0.5 monolayers per second. The cap layer is advantageously grown using MBE such that the cap layer can be formed before segregation occurs.

Next, as shown in block 412, the steps denoted by blocks 405, 406, 408, and 410 can be repeated until a preselected time or a desired number of alternating layers are achieved. Before each repetition of the steps denoted by blocks 405, 406, 408, and 410, the flux of the group V material is reduced, as indicated by block 414. Once the process of creating an active region is completed, which is generally once a device with the desired number of quantum wells is rendered from the process, the process can transition to subsequent device processing steps. As part of the transition out of forming the active region, the temperature is raised as shown in block 416. Preferably, the temperature is raised to greater than about 500° C., more preferably in a range of from about 550° C. to about 620° C., more preferably to about 585° C. At the beginning of the upward temperature ramp the flux of the group V material is lowered to about 1.20E-05 Torr BEP to about 2.13E-5 Torr BEP, more preferably to about 1.6E-5 Torr BEP.

The foregoing methods of the invention have enabled the formation of extremely low photoluminescence line widths of about 22 nm full width half maximum at 1230 nm, indicating extremely flat interfaces.

Figure 8:
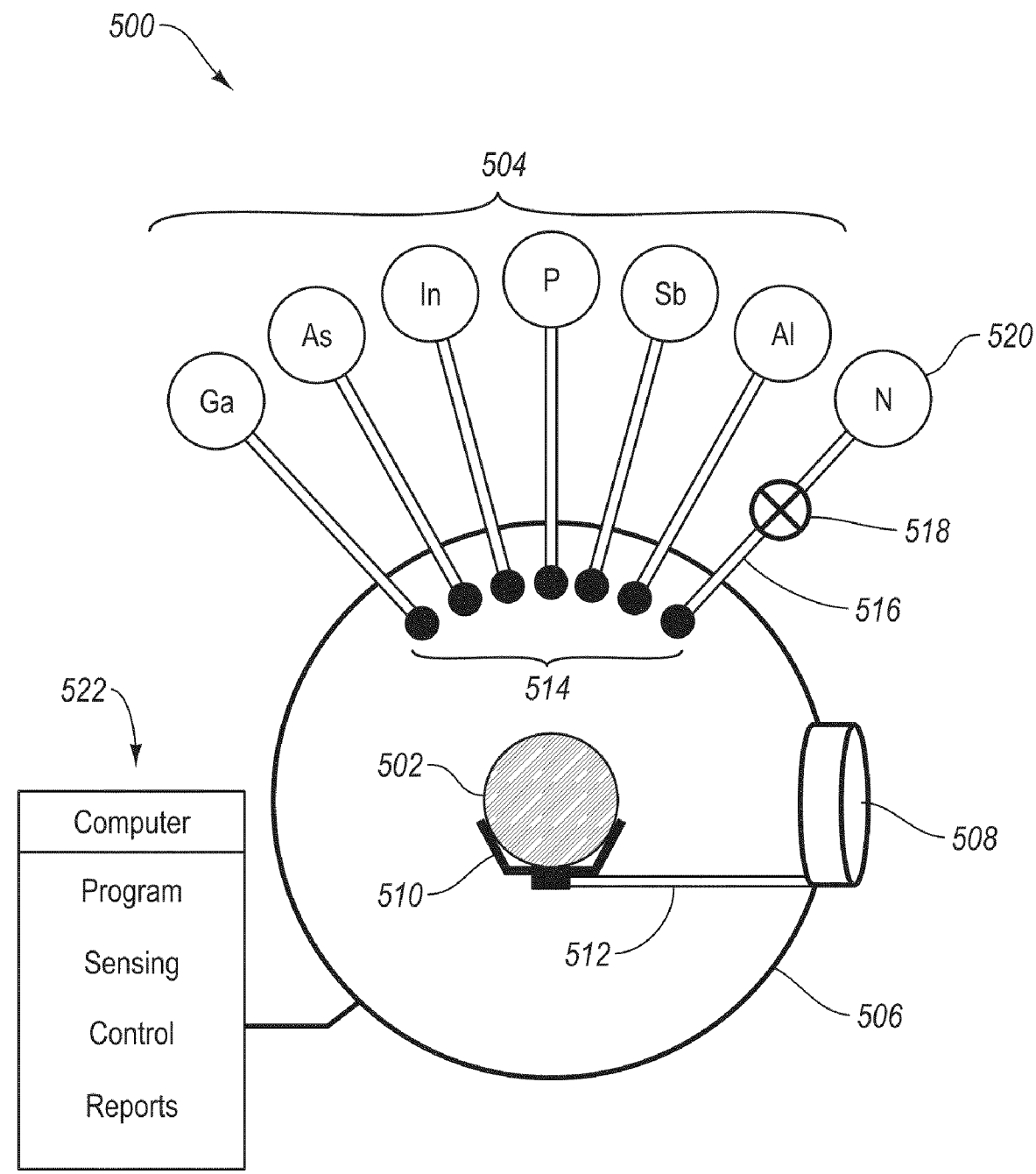
FIG. 8 illustrates a block diagram of a system that can be used to carry out the methods of the present invention.

With nitrogen containing quantum wells that are normally used in MBE, it is important to be able to effectively shut off any nitrogen source while attempting to grow a MEE structure. The present inventors have incorporated a gate valve on the source line leading into an MBE system in order to accomplish complete nitrogen blockage. It was found that shutters are only minimally useful to interrupt the nitrogen. Referring to FIG. 8, an MBE system 500 is illustrated having a semiconductor wafer processing chamber 506. A typical processing chamber can include a port 508 through which a semiconductor wafer 502 can be placed onto a wafer holder 510. The wafer holder, with wafer, can then be placed into an optimal processing position within the chamber 506 via a track 512. Several sources 504 (e.g. Ga, As, Sb, In, P, N, etc.) can lead into the chamber 506. Each source 504 is generally controlled in the chamber with shutters 514. Unfortunately, use of a shutter has not been effective in blocking nitrogen 520 for MEE processes. Therefore, a gate valve 518 can be spliced into the nitrogen source line 516. The gate valve 518 can be used to completely cut-off the flow of nitrogen 520 into the chamber 506 during non-nitrogen MEE processing steps.

Complete nitrogen cut-off can be achieved with manual (e.g. a human operator), electro-mechanical and/or microprocessor control of a microprocessor, or operator (not shown). A microprocessor-based system 522 will commonly be used with the processing hardware (e.g. chamber, shutters, gate valves, etc.) for executing programmed processing instructions (e.g. software programs), collect measured data from measurement transducers (not shown), provide and maintain processing control, report creation, and data/software storage.

The present invention also relates to optical transceivers that incorporate the VCSELs of the present invention. The VCSELs described herein can be used to transmit digital data in the form of light signals through a fiber optic cable. Such light signals allow for high data transmission rates and high bandwidth capabilities. The long wavelength VCSELs of the present invention can be particularly advantageous for fiber optic applications because the light signal can be transmitted over longer distances than shorter wavelength VCSELs.

In data networks, optical signals often need to be converted to electronic signals and electrical signals often need to be converted to optical signals. These conversions can be performed using a transceiver that incorporates the VCSEL according to the present invention. A transmitting optical subassembly (TOSA) can be used to convert electronic signals to optical signals. A TOSA uses an electronic signal to drive the VCSEL of the present invention thereby generating an optical signal. When optical signals are converted to electronic signals, a receiving optical subassembly (ROSA) can be used. The ROSA has a photodiode that, in conjunction with other circuitry, detects optical signals and converts the optical signals to electronic signals.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An active region associated with a semiconductor laser, comprising:
    a first flattening layer comprising a first section having from about 7 to about 73 alternating monolayers of group III and group V elements;
    a nitrogen containing quantum well formed on the flattening layer, wherein the flattening layer is grown with a flux of group V elements and the quantum well is grown with a higher flux of group V elements than at least a portion of the monolayers of the flattening layer; and
    a cap layer formed on the quantum well;
    a plurality of additional quantum wells, wherein each quantum well has a flattening layer on a first surface thereof and a cap layer on a second surface thereof.

2. An active region as defined in claim 1, wherein the flattening layer is substantially nitrogen free.

3. An active region as defined in claim 1, wherein the cap layer comprises GaAs.

4. An active region as defined in claim 1, wherein the cap layer comprises GaAsN.

5. An active region as defined in claim 1, wherein the quantum well comprises InGaAsN.

6. An active region as defined in 1, wherein the quantum well comprises InGaAsNSb.

7. An active region as defined in claim 1, wherein the quantum well comprises InGaAsN.

8. A VCSEL comprising an active region as defined in claim 1.

9. A VCSEL as defined in claim 8, further comprising:
    a GaAs substrate; a GaAs/AlGaAs lower Bragg reflector formed on the substrate;
    a lower cladding layer formed on the lower Bragg reflector;
    the active region as defined in claim 1 formed on the lower cladding region, wherein the group III constituent comprises Ga and the group V constituent comprises As;
    an upper cladding layer formed on the active region; and
    a GaAs upper Bragg reflector formed on the upper cladding layer.

10. An active region associated with a semiconductor laser, comprising:
    a plurality of nitrogen containing quantum wells, each quantum well having a flattening layer on a first surface thereof and a cap layer on a second surface thereof,
        the flattening layer comprising a first section having from about 7 to about 73 alternating monolayers of group III and group V elements; and
        the quantum well comprising InGaAsN and being formed on the flattening layer, wherein the flattening layer is grown with a flux of group V elements and the quantum well is grown with a higher flux of group V elements than at least a portion of the monolayers of the flattening layer.

11. An active region as defined in claim 10, wherein the flattening layer is substantially nitrogen free.

12. An active region as defined in claim 10, wherein the cap layer comprises GaAs.

13. An active region as defined in claim 10, wherein the cap layer comprises GaAsN.

14. An active region as defined in claim 10, wherein the quantum well comprises InGaAsN.

15. An active region as defined in 10, wherein the quantum well comprises InGaAsNSb.

16. A VCSEL comprising an active region as defined in claim 10.

17. A VCSEL as defined in claim 16, further comprising:
    a GaAs substrate;
    a GaAs/AlGaAs lower Bragg reflector formed on the substrate;
    a lower cladding layer formed on the lower Bragg reflector;
    the active region as defined in claim 11 formed on the lower cladding region, wherein the group III constituent comprises Ga and the group V constituent comprises As;
    an upper cladding layer formed on the active region; and
    a GaAs upper Bragg reflector formed on the upper cladding layer.

* * * * *